(12) United States Patent
Ishiura

(10) Patent No.: US 9,331,456 B2
(45) Date of Patent: May 3, 2016

(54) METHOD OF MANUFACTURING SEMICONDUCTOR LASER

(71) Applicant: Sumitomo Electric Device Innovations, Inc., Yokohama-shi (JP)

(72) Inventor: Masami Ishiura, Yokohama (JP)

(73) Assignee: Sumitomo Electric Device Innovations, Inc., Yokohama-shi (JP)

(*) Notice: Subject to any disclaimer, the term of this patent is extended or adjusted under 35 U.S.C. 154(b) by 0 days.

(21) Appl. No.: 14/446,004

(22) Filed: Jul. 29, 2014

(65) Prior Publication Data

US 2015/0037919 A1 Feb. 5, 2015

(30) Foreign Application Priority Data

Jul. 30, 2013 (JP) ................................. 2013-158314

(51) Int. Cl.
| | |
|---|---|
| *H01S 5/00* | (2006.01) |
| *H01L 27/15* | (2006.01) |
| *H01S 5/32* | (2006.01) |
| *H01S 5/227* | (2006.01) |
| *H01S 5/30* | (2006.01) |
| *H01S 5/343* | (2006.01) |
| *H01S 5/22* | (2006.01) |
| *H01L 21/02* | (2006.01) |

(52) U.S. Cl.
CPC ............. *H01S 5/3211* (2013.01); *H01S 5/3213* (2013.01); *H01L 21/0262* (2013.01); *H01L 21/02392* (2013.01); *H01L 21/02395* (2013.01); *H01L 21/02433* (2013.01); *H01L 21/02516* (2013.01); *H01L 21/02543* (2013.01); *H01L 21/02546* (2013.01); *H01L 21/02576* (2013.01); *H01L 21/02581* (2013.01); *H01S 5/227* (2013.01); *H01S 5/2224* (2013.01); *H01S 5/3054* (2013.01); *H01S 5/3202* (2013.01); *H01S 5/34306* (2013.01); *H01S 2304/04* (2013.01); *H01S 2304/12* (2013.01)

(58) Field of Classification Search
CPC ... H01S 5/34333; H01S 5/3202; H01S 5/222; H01S 5/20; H01S 5/2231; H01L 3/067; H01L 3/06733; H01L 33/0045; H01L 29/045
See application file for complete search history.

(56) References Cited

U.S. PATENT DOCUMENTS

| | | | |
|---|---|---|---|
| 2004/0041162 A1* | 3/2004 | Shimoyama et al. | 257/91 |
| 2013/0183783 A1* | 7/2013 | Katsuyama | 438/47 |

FOREIGN PATENT DOCUMENTS

| | | |
|---|---|---|
| JP | 06-045708 | 2/1994 |
| JP | 2011-249766 | 12/2011 |

* cited by examiner

*Primary Examiner* — Pamela E Perkins
(74) *Attorney, Agent, or Firm* — Venable LLP; Michael A. Sartori; Tamatane J. Aga

(57) ABSTRACT

A method of manufacturing a semiconductor laser according to an aspect of the present invention includes (a) sequentially epitaxially growing a first cladding layer, an active layer and a second cladding layer on a semiconductor substrate composed of InP or GaAs and having a plane index of (100), (b) forming a plurality of growth start surfaces having a plane index greater than (100) in an upper surface of the second cladding layer, and (c) epitaxially growing a third cladding layer containing zinc in the plurality of growth start surfaces of the second cladding layer.

15 Claims, 6 Drawing Sheets

(a)

(b)

(a)

(b)

(c)

(a)

(b)

METHOD OF MANUFACTURING SEMICONDUCTOR LASER

BACKGROUND OF THE INVENTION

1. Field of the Invention

The present invention relates to a method of manufacturing a semiconductor laser.

2. Related Background Art

In an optical semiconductor device using a compound semiconductor, an active layer that generates light and a cladding layer for confining carriers and light in the active layer are stacked in an axial direction. Reduction of a serial resistance of the optical semiconductor device is important to increase light emission efficiency and light output. A technology for doping a cladding layer with, for example, magnesium (Mg) or zinc (Zn) is described in Japanese Patent Application Laid-Open Publication Nos. H6-45708 and 2011-249766.

SUMMARY OF THE INVENTION

However, it is difficult to increase a carrier concentration of the cladding layer formed on the active layer and, for example, an upper limit of the carrier concentration is about $1.0 \times 10^{18}$ cm$^{-3}$. When the carrier concentration is low, serial resistance of a semiconductor device increases and thus light emission efficiency and light output decrease. The present invention has been made in view of the problem described above, and an object of the present invention is to provide a method of manufacturing a semiconductor laser which is capable of increasing carrier concentration of a cladding layer.

A method of manufacturing a semiconductor laser according to one aspect of the present invention includes (a) sequentially epitaxially growing a first cladding layer, an active layer and a second cladding layer on a semiconductor substrate composed of InP or GaAs and having a plane index of (100); (b) forming a plurality of growth start surfaces having a plane index greater than (100) in an upper surface of the second cladding layer; and (c) epitaxially growing a third cladding layer containing zinc in the plurality of growth start surfaces of the second cladding layer.

With the method of manufacturing a semiconductor laser according to the above aspect of the present invention, it is possible to increase the carrier concentration of the cladding layer.

BRIEF DESCRIPTION OF THE DRAWINGS

Parts a and b of FIG. 1 are cross-sectional views illustrating a semiconductor device according to a first embodiment.

Part a of FIG. 2 is a cross-sectional view illustrating a sample S of an experiment to clarify a relationship between a plane index and a carrier concentration, and Part b of FIG. 2 is a diagram illustrating a relationship between a plane index and a carrier concentration.

Figure 3:
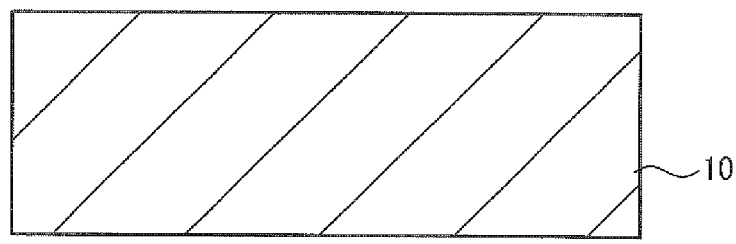
Figure 3:
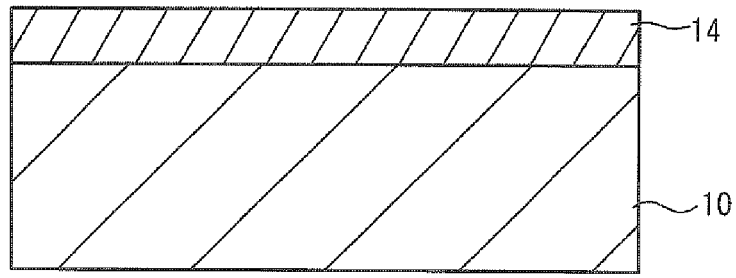
Figure 3:
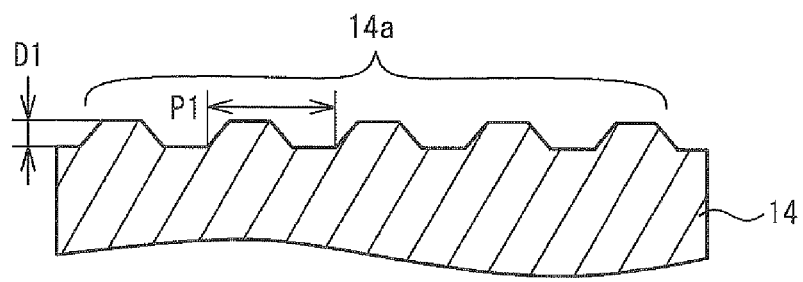

Part a to Part c of FIG. 3 are cross-sectional views illustrating a method of manufacturing a semiconductor laser.

Figure 4:
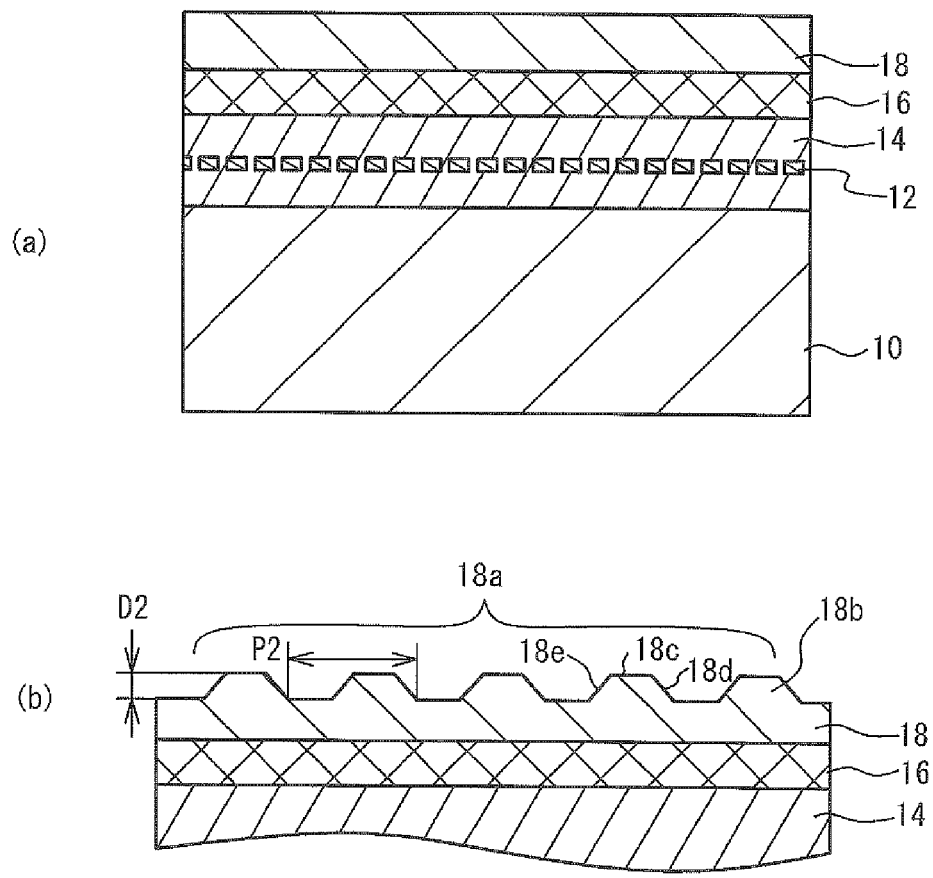

Part a to Part b of FIG. 4 are cross-sectional views illustrating the method of manufacturing a semiconductor laser.

Figure 5:
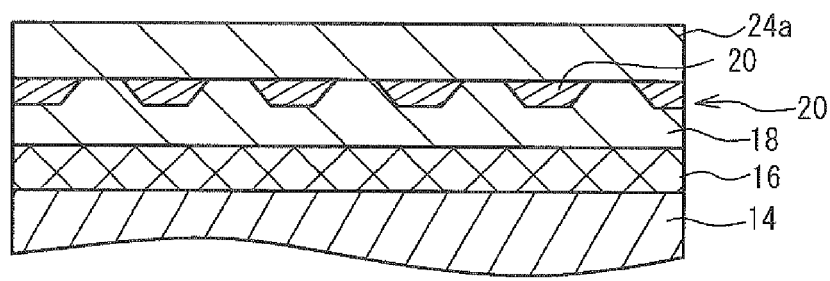

FIG. 5 is a cross-sectional view illustrating the method of manufacturing a semiconductor laser.

Figure 6:
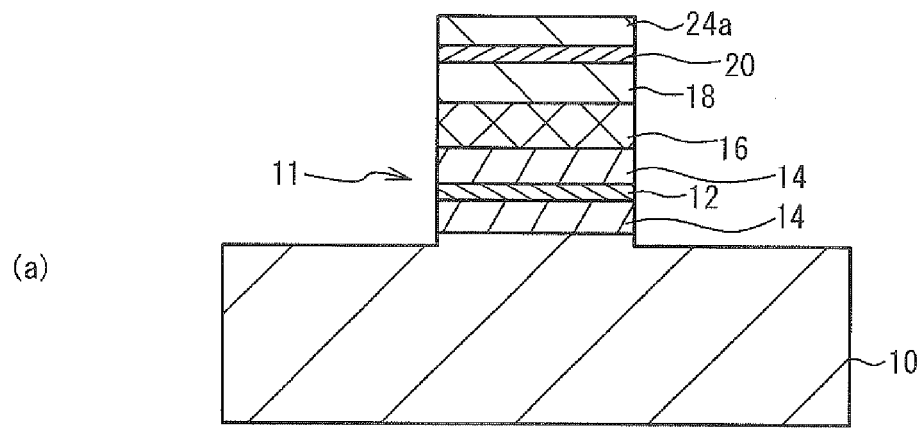
Figure 6:
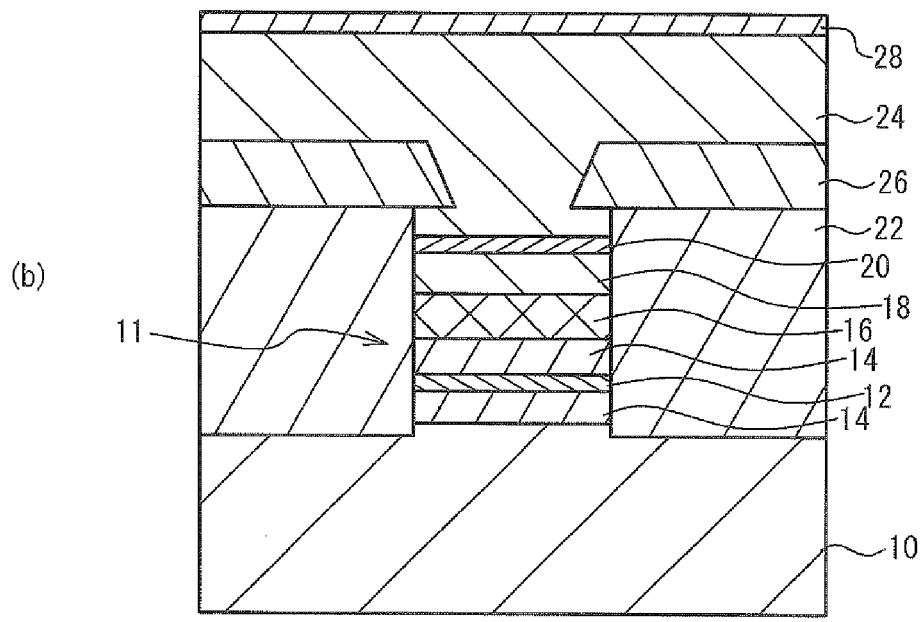

Part a and Part B of FIG. 6 are cross-sectional views illustrating the method of manufacturing a semiconductor laser.

DESCRIPTION OF THE PREFERRED EMBODIMENTS (Description of Embodiments of the Present Invention)

First, content of an embodiment of the present invention will be listed and described. A method of manufacturing a semiconductor laser according to one embodiment of the present invention includes (a) sequentially epitaxially growing a first cladding layer, an active layer and a second cladding layer on a semiconductor substrate composed of InP or GaAs and having a plane index of (100); (b) forming a plurality of growth start surfaces having a plane index greater than (100) in an upper surface of the second cladding layer; and (c) epitaxially growing a third cladding layer containing zinc in the plurality of growth start surfaces of the second cladding layer.

In the above embodiment, a surface of the semiconductor substrate may be tilted in a range of ±1° from (100).

In the above embodiment, the plane index of the plurality of growth start surfaces of the second cladding layer may be (311) or (411).

In the above embodiment, a surface having a plane index of (100) and the plurality of growth start surfaces may be provided in the upper surface of the second cladding layer.

In the above embodiment, in the step (b), the plurality of growth start surfaces may be formed in the upper surface of the second cladding layer so that the upper surface of the second cladding layer includes a surface having a plane index of (100) and the plurality of growth start surfaces.

In the above embodiment, a growth rate of the third cladding layer in the step (c) may be smaller than a growth rate of the second cladding layer in the step (a).

In the above embodiment, a difference between a refractive index of the second cladding layer and a refractive index of the third cladding layer may be 1.0% or less.

In the above embodiment, the method may further comprise (d) forming a fourth cladding layer on the second and third cladding layers.

In the above embodiment, the method may further comprise (e) etching the first cladding layer, the active layer, the second cladding layer, the third cladding layer and the fourth cladding layer to form a mesa including them in a stripe shape.

In the above embodiment, the method may further comprise (f) forming a first buried layer on both sides of the mesa in a stripe shape.

In the above embodiment, the method may further comprise (g) forming a second buried layer on the first buried layer.

In the above embodiment, the method may further comprise (h) forming a fifth cladding layer on the second buried layer and the fourth cladding layer.

In the above embodiment, the method may further comprise (i) forming a contact layer on the fifth cladding layer.

In the above embodiment, the first, second and third cladding layers may be composed of InP.

(Details of Embodiments of the Present Invention)

Embodiments of the present invention will be described with reference to the drawings.

(First Embodiment)

Figure 1:
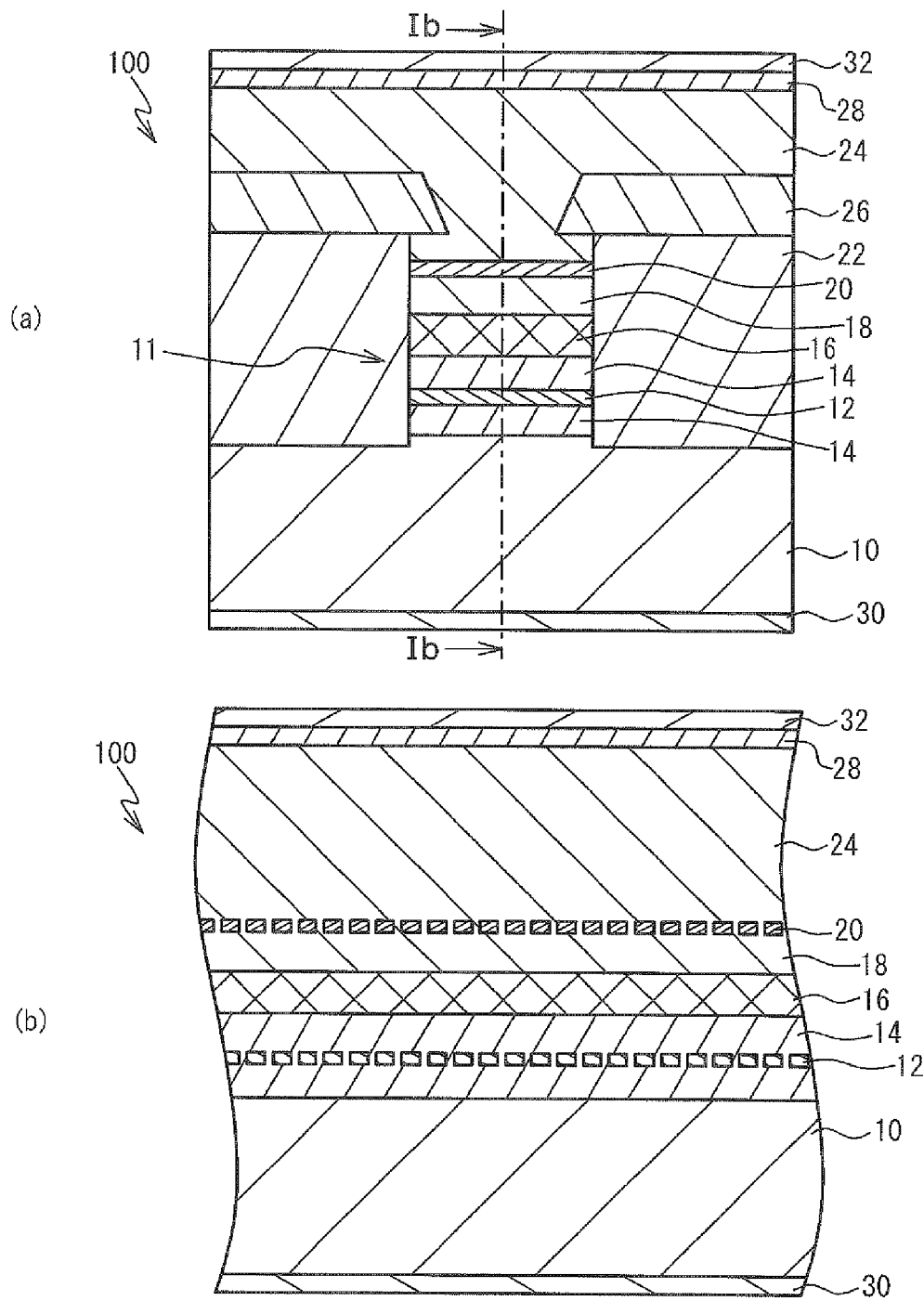

Part a and Part b of FIG. 1 are cross-sectional views illustrating a semiconductor laser 100 according to a first embodiment. In Part a of FIG. 1, the semiconductor laser 100 is viewed from a propagation direction of light. Part b of FIG. 1 illustrates a cross-section taken along a line Ib-Ib of Part a of FIG. 1 and illustrates a cross-section of the semiconductor laser 100 along the propagation direction.

In the semiconductor laser 100 of the present embodiment, an n electrode 30, a substrate 10, a cladding layer 14 (a first cladding layer), an active layer 16, a cladding layer 18 (a second cladding layer), a cladding layer 24, a contact layer 28 and a p electrode 32 are stacked sequentially from the bottom, as illustrated in Part a and part b of FIG. 1. The cladding layers 14, 18 and 24 and the active layer 16 form a mesa stripe structure 11. A buried layer 22 is provided on both sides of the mesa stripe structure 11. A buried layer 26 is stacked on the buried layer 22, and the cladding layer 24 is stacked on the buried layer 26. A layer 12 functioning as a diffraction grating is provided in the cladding layer 14. The cladding layer 18 and the cladding layer 24 function as one p type cladding layer, and a highly doped layer 20 serving as a third cladding layer is formed in an upper surface of the cladding layer 18.

The substrate 10 which is a semiconductor substrate is formed of, for example, n-type indium phosphide (n-InP) doped with tin (Sn) at a concentration of $1.0 \times 10^{18}$ cm$^{-3}$. The cladding layer 14 is formed of, for example, n-type indium phosphide (n-InP) having a thickness of 0.5 μm that is doped with silicon (Si) at a concentration of $1.0 \times 10^{18}$ cm$^{-3}$. The substrate 10 and the cladding layer 14 function as one n-type cladding layer. The active layer 16 is an InGaAsP/InGaAsP multiple quantum well layer formed, for example, of indium gallium arsenide phosphide. The cladding layer 18 (the second cladding layer) is in contact with an upper surface of the active layer 16. The cladding layer 18 and the cladding layer 24 are formed of p-InP doped with zinc (Zn). A difference between a refractive index of the cladding layer 18 and a refractive index of the cladding layer 24 is 1.0% or less. The highly doped layer 20 which is the third cladding layer is formed of p-InP doped with zinc (Zn). The highly doped layer 20 is a layer having a carrier concentration higher than those of the cladding layer 18 and the cladding layer 24. In other words, the carrier concentration of the highly doped layer 20 is higher than the carrier concentrations of the cladding layer 18 and the cladding layer 24. The carrier concentration results from acceptors based on zinc (Zn).

The buried layer 22 is formed of a high resistance semiconductor or a p-type semiconductor doped with impurities forming a deep acceptor level. The buried layer 22 is formed, for example, of p-InP having a thickness of 1.3 μm that is doped with iron (Fe) at a concentration of $7.0 \times 10^{16}$ cm$^{-3}$ or Zn at a concentration of $5.0 \times 10^{17}$ cm$^{-3}$. The buried layer 26 is formed of, for example, n-InP having a thickness of 0.45 μm that is doped with sulfur (S) at a concentration of $1.0 \times 10^{19}$ cm$^{-3}$. The contact layer 28 is formed of, for example, p type indium gallium arsenide (p-InGaAs) having a thickness of 0.5 μm that is doped with Zn at a concentration of $1.0 \times 10^{18}$ cm$^{-3}$. The n electrode 30 is formed of a film (Au/Ge/Au) obtained by stacking gold, germanium, and gold from the substrate 10, or of Au/Ge/nickel (Ni)/Au. The p electrode 32 is formed of, for example, Au/Zn/Au or titanium (Ti)/platinum (Pt)/Au.

It is efficient to reduce the serial resistance in order to increase the light output of the semiconductor laser 100. For reduction of the serial resistance, a carrier concentration of the p type cladding layer should be increased. The carrier concentration was measured for every plane index of p-InP.

Figure 2:
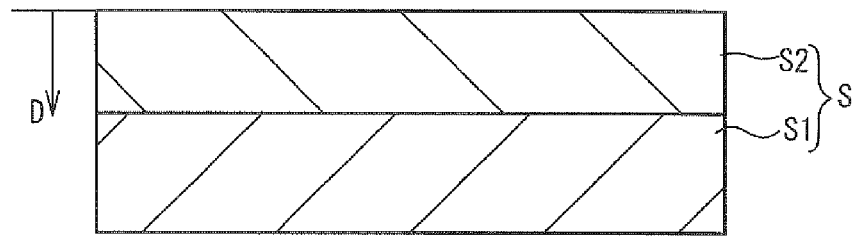
Figure 2:
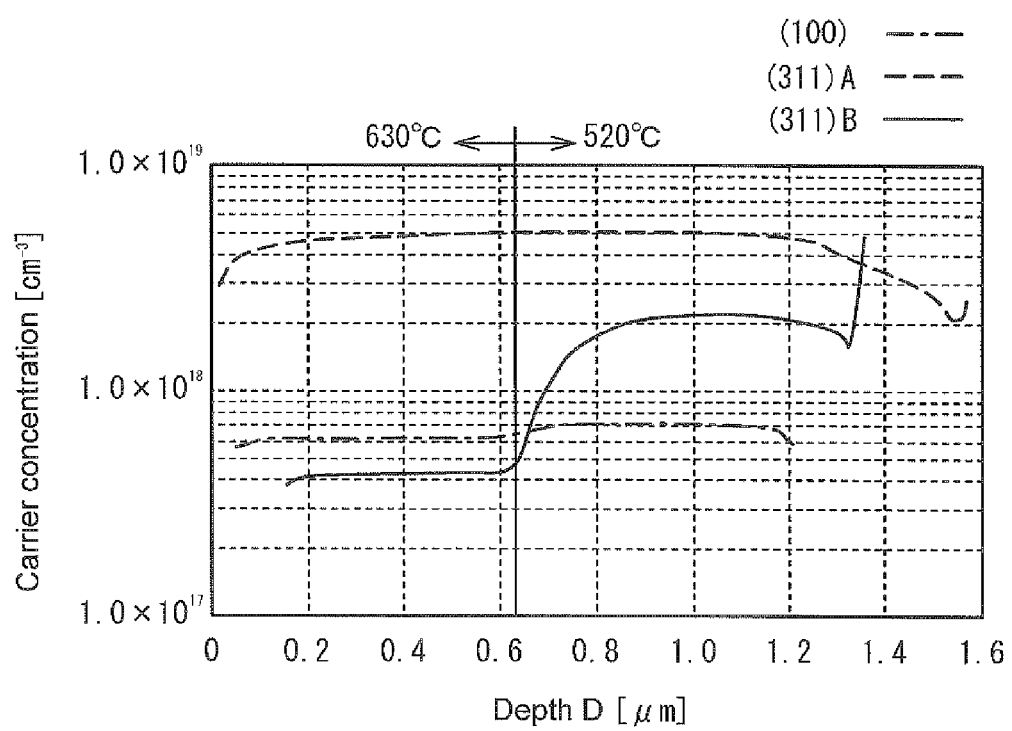

Part a of FIG. 2 is a cross-sectional view illustrating a sample S of an experiment for clarifying a relationship between a plane index and a carrier concentration. The sample S is a p-InP layer. Three types of the samples S having a different plane index were used. The plane indexes of growth surfaces of the three samples S are (100), (311)A and (311)B respectively. The samples S were epitaxially grown using metal organic chemical vapor deposition (MOCVD). Growth conditions are shown below.

In raw material: Trimethyl indium (TMIn)
P raw material: Phosphine (PH$_3$)
Dopant raw material: Dimethylezinc (DMZ)
Growth temperature: 520° C., 630° C.
Growth rate: 2.0 μm/h In the sample S, a layer S1 whose depth D from the upper surface ranged from 0.6 μm to 1.3 μm was grown at 520° C., and a layer S2 whose depth D ranged from 0 μm to 0.6 μm was grown at 630° C.

Part b of FIG. 2 is a diagram illustrating a relationship between a plane index and a carrier concentration. A horizontal axis indicates a depth D, and a vertical axis indicates the carrier concentration. An Alternate long and short dash line indicates a measurement result of the sample S having a plane index (100), a dashed line indicates a measurement result of the sample S having a plane index (311)A, and a solid line indicates a measurement result of the sample S having a plane index (311)B. Table 1 is a table showing the carrier concentration.

TABLE 1

| D [μm] | Growth temperature [° C.] | Carrier concentration [cm$^{-3}$] | | |
|---|---|---|---|---|
| | | (100) | (311)A | (311)B |
| 1.0 | 520 | $7.14 \times 10^{17}$ | $5.07 \times 10^{18}$ | $2.20 \times 10^{18}$ |
| 0.4 | 630 | $6.17 \times 10^{17}$ | $4.85 \times 10^{18}$ | $4.33 \times 10^{17}$ |

As illustrated in Part b of FIG. 2 and Table 1, in a depth of about 1.0 μm (growth temperature of 520° C.), a carrier concentration of a sample S in which a growth surface is the (311)A surface is about 7 times and a carrier concentration of a sample S in which a growth surface is a (311)B surface is about 3 times compared to a carrier concentration of a sample S in which a growth surface is a (100) surface. In a depth of about 0.4 μm (growth temperature of 630° C.), the carrier concentration of the sample S in which the growth surface is the (311)A surface is about 7.8 times and the carrier concentration of the sample S in which the growth surface is the (311)B surface is about 0.6 times compared to the carrier concentration of the sample S in which the growth surface is the (100) surface. When the growth temperature is 520° C., the carrier concentrations of the sample S in which the growth surface is the (311)A surface and the sample S in which the growth surface is the (311)B surface are much higher than the carrier concentration of the sample S in which the growth surface is the (100) surface. In the semiconductor laser 100 of the present embodiment, based on the above-described findings, the carrier concentration of the layer (specifically, the highly doped layer 20) on the cladding layer 18 is increased by forming the surfaces of the plane indexes (311)A and (311)B in the cladding layer 18.

Part a of FIG. 3 to Part b of FIG. 6 are cross-sectional views illustrating a method of manufacturing the semiconductor laser 100. Part a of FIG. 3 to FIG. 5 illustrate sections viewed in the same direction as Part b of FIG. 1. Part a and Part b of FIG. 6 illustrate sections viewed in the same direction as Part a of FIG. 1.

Part a of FIG. 3 illustrates the substrate 10. The substrate 10 is formed of n-type InP, and a plane index thereof is (100). In addition, the plane index of the substrate 10 is allowed to be tilted from a (100) surface. An allowed angle of the tilt is in a range of ±1° from (100). The cladding layer 14 is then grown in an upper surface of the substrate 10 in a part in a film thickness direction using the MOCVD method, as illustrated in Part b of FIG. 3. A layer 12 is then formed on the upper surface of the cladding layer 14. Part c of FIG. 3 is a view illustrating an enlarged upper surface of the cladding layer 14. For example, an irregularity 14a is formed in the upper surface of the cladding layer 14 through a dry etching process such as RIE (Reactive Ion Etching), as illustrated in Part c of FIG. 3. Further, a resist mask (not illustrated) used for the etching is formed in a predetermined pattern using a known interference exposure method or electron beam exposure method. A pitch P1 of the irregularity 14a ranges from 200 nm to 250 nm, and a depth D1 thereof is 30 nm.

The layer 12 (e.g., InGaAsP) of a semiconductor lattice-matching with n-InP and having a different refractive index from n-InP is then provided by burying a recess portion of the irregularity 14a, as illustrated in Part a of FIG. 4. A remaining portion in the film thickness direction of the cladding layer 14, the active layer 16, and the cladding layer 18 are sequentially stacked. The MOCVD method is used for growth of these layers. The layer 12 is surrounded by the cladding layer 14, as illustrated in Part a of FIG. 4. A pattern of the layer 12 is determined by the irregularity 14a, and the layer 12 acts as a diffraction grating.

Part b of FIG. 4 and FIG. 5 are views of an enlarged upper surface of the cladding layer 18. After the cladding layer 18 is formed, an irregularity 18a is formed in an upper surface of the cladding layer 18, as illustrated in Part b of FIG. 4. A mask used for etching may adopt the same pattern as the mask used in an etching process for the cladding layer 14. The RIE may be used for etching for forming this irregularity 18a, as in the irregularity 14a. In this case, conditions under which (311) is easily obtained (conditions under which a (311) plane is easily formed in a part of the upper surface of the cladding layer 18), such as an SWB (saturated water solution of bromine) or a methane hydrogen ($CH_3$—$H_2$)-based etching gas as an etchant and RF power of 300 W, are adopted. Through this process, a surface having a plane index greater than the plane index of the surface of the cladding layer 18 is expressed in an inner surface of the irregularity 18a. In the present embodiment, a side surface 18d and a side surface 18e of a convex portion 18b of the irregularity 18a are tilted by about 25° with respect to an upper surface 18c thereof. The upper surface 18c has a plane index (100), the side surface 18d has a plane index (311)A, and the side surface 18e has a plane index (311)B.

In other words, a plurality of side surfaces 18d and side surfaces 18e having a plane index greater than (100) are formed in the upper surface of the cladding layer 18 through the above process. More specifically, the plurality of side surfaces 18d and side surfaces 18e are formed in the upper surface of the cladding layer 18 so that the upper surface of the cladding layer 18 includes the upper surfaces 18c that are the surfaces having a plane index of (100), the plurality of side surfaces 18d having a plane index of (311)A, and the plurality of side surfaces 18e having a plane index of (311)B in the above process. The side surface 18d and the side surface 18e are growth start surfaces on which the highly doped layer 20 is grown in a subsequent process. Further, a pitch P2 of the irregularity 18a ranges from 200 nm to 250 nm which is the same level as the pitch P1 of the irregularity 14a. A depth D2 of the irregularity 18a is 30 nm which is the same level as the depth D1 of the irregularity 14a.

The highly doped layer 20 is then formed to bury the irregularity 18a using the MOCVD method under conditions of a growth temperature of 520° C. and a growth rate of 1.0 μm/h, as illustrated in FIG. 5. The highly doped layer 20 is epitaxially grown from the surface of the cladding layer 18, including the growth start surfaces including the side surfaces 18d and 18e of the cladding layer 18. In other words, the highly doped layer 20 is grown on the plurality of side surfaces 18d and 18e that are the growth start surfaces in the upper surface of the cladding layer 18. The cladding layer 24a is then formed on the highly doped layer 20. For example, a growth temperature of the cladding layer 24a is 630° C., and a growth rate thereof is 2.0 μm/h.

The mesa stripe structure 11 is formed, for example, through an etching process, as illustrated in Part a of FIG. 6. Using the MOCVD method, the buried layer 22 is formed on both sides of the mesa stripe structure 11, the buried layer 26 is formed on the buried layer 22, and the cladding layer is formed on the buried layer 26, as illustrated in Part b of FIG. 6. The cladding layer on the buried layer 26 is integrally formed with the cladding layer 24a illustrated in FIG. 5 to form the cladding layer 24. The contact layer 28 is formed on the cladding layer 24. The n electrode 30 is formed on a lower surface of the substrate 10, and the p electrode 32 is formed on an upper surface of the contact layer 28. The semiconductor laser 100 is formed through the above-described process.

Further, the dopant raw material of Zn used to dope the cladding layer 18, the highly doped layer 20 and the cladding layer 24 may be diethylzinc (DEZ), in addition to DMZ. The dopant raw material of the layer (the buried layer 22) doped with Fe may be ferrocene (Fe $(C_5H_5)_2$). The dopant raw material of the layer (the buried layer 26) doped with S may be hydrogen sulfide ($H_2S$). The dopant raw material of the layer (the cladding layer 14) doped with Si may be silane ($SiH_4$) or disilane ($Si_2H_6$).

With the semiconductor laser 100 according to the first embodiment, the irregularity 18a is formed in the cladding layer 18, as illustrated in Part b of FIG. 4. The side surface 18d of the irregularity 18a has a plane index (311)A, and the side surface 18e thereof has a plane index (311)B. Incorporation of Zn is promoted on the (311)A surface and the (311)B surface, and the carrier concentration on the (311)A surface and the (311)B surface becomes higher than that on the (100) surface under the same condition, as illustrated in Part b of FIG. 2. In other words, the incorporation of Zn is promoted in the p-InP layer in which the growth surfaces are the (311)A surface and the (311)B surface, and the carrier concentration in the p-InP layer in which the growth surfaces are the (311)A surface and (311)B surface becomes higher than the carrier concentration in the p-InP layer in which the growth surface is the (100) surface under the same condition, as illustrated in Part b of FIG. 2.

The highly doped layer 20 illustrated in FIG. 5 includes a crystal growth layer of which the growth start surfaces are the side surfaces 18d and 18e. In this embodiment, the cladding layers 18 and 24a and the highly doped layer 20 are all formed of InP, and growth conditions and a dopant supply amount therefor are also the same. However, impurity incorporation states of the cladding layers 18 and 24a and the highly doped layer 20 are different due to a difference in plane index (a difference between plane indexes of the surfaces from which the cladding layers 18 and 24a and the heavily doped layer 20 start growth) described above. As a result, the carrier concentration of the highly doped layer 20 becomes higher than those of the cladding layers 18 and 24a. If an upper limit of the carrier concentration in the p-InP layer in which the growth surface is the (100) surface is about $1.0 \times 10^{18}$ $cm^{-3}$, although it also depends on the growth condition, the carrier concentration of the highly doped layer 20 formed under the same growth condition can increase to about $5.0 \times 10^{18}$ $cm^{-3}$. Accordingly, the average carrier concentration of the highly doped layer 20 increases, and thus serial resistance of the semiconductor laser 100 decreases. As a result, light output and light emission efficiency are improved.

The growth temperature and the growth rate may be changed. The growth temperature may be higher than 520° C. However, when the temperature becomes higher, the carrier concentration of the p-InP layer in which the growth surface is the (311)A surface decreases, as illustrated in Part b of FIG. 2. It is desirable for the growth temperature to be 480° C. or more and 520° C. or less in order to greatly increase the carrier concentration. For example, the growth temperature may be 460° C. or more, 470° C. or more, or 490° C. or more or may be 510° C. or less, 530° C. or less or 540° C. or less. It is preferable for the growth rate of the highly doped layer 20 to be smaller than the growth rate of the cladding layer 18. Accordingly, the incorporation of Zn into the highly doped layer 20 is promoted. It is preferable for the growth rate of the cladding layer 24a to be smaller than the growth rate of the highly doped layer 20. Accordingly, the incorporation of Zn into the cladding layer 24a is promoted.

The side surface 18d and the side surface 18e may have a plane index higher than the plane index (100) of the upper surface 18c, e.g., (311) or (411). This is because the incorporation of Zn is promoted. Zn is used as the dopant of the cladding layer 18 and the cladding layer 24. In addition to InP, an InP-based semiconductor lattice-matching with InP, gallium arsenide (GaAs), or a GaAs-based semiconductor lattice-matching with GaAs may be used as the growth material of the cladding layer 18 and the cladding layer 24.

While the example of the semiconductor laser having a pn-BH (pn-buried hetero) structure has been described in the first embodiment, the semiconductor laser of the first embodiment may be a semiconductor laser having a semi-insulating buried hetero (SIBH) structure or a semi-insulating planar buried hetero (SIPBH) structure.

While the embodiments of the present invention have been described above, the present invention is not limited to such specific embodiments. Various variations or modifications can be made to the present invention without departing from the spirit and scope of the present invention defined in claims.

What is claimed is:

1. A method of manufacturing a semiconductor laser, comprising:
    (a) sequentially epitaxially growing a first cladding layer, an active layer and a second cladding layer on a semiconductor substrate composed of InP or GaAs and having a plane index of (100);
    (b) forming a plurality of growth start surfaces having a plane index greater than (100) along a waveguide direction of the semiconductor laser in an upper surface of the second cladding layer by forming a plurality of irregularities in the upper surface of the second cladding layer; and
    (c) epitaxially growing a third cladding layer containing zinc in the plurality of growth start surfaces of the second cladding layer.

2. The method of manufacturing a semiconductor laser according to claim 1, wherein a surface of the semiconductor substrate is tilted in a range of ±1° from (100).

3. The method of manufacturing a semiconductor laser according to claim 1, wherein the plane index of the plurality of growth start surfaces of the second cladding layer is (311) or (411).

4. The method of manufacturing a semiconductor laser according to claim 3, wherein a surface having a plane index of (100) and the plurality of growth start surfaces are provided in the upper surface of the second cladding layer.

5. The method of manufacturing a semiconductor laser according to claim 3, wherein: in the step (b), the plurality of growth start surfaces are formed in the upper surface of the second cladding layer so that the upper surface of the second cladding layer includes a surface having a plane index of (100) and the plurality of growth start surfaces.

6. The method of manufacturing a semiconductor laser according to claim 1, wherein a growth rate of the third cladding layer in the step (c) is smaller than a growth rate of the second cladding layer in the step (a).

7. The method of manufacturing a semiconductor laser according to claim 1, wherein a difference between a refractive index of the second cladding layer and a refractive index of the third cladding layer is 1.0% or less.

8. The method of manufacturing a semiconductor laser according to claim 1, further comprising (d) forming a fourth cladding layer on the second and third cladding layers.

9. The method of manufacturing a semiconductor laser according to claim 8, further comprising (e) etching the first cladding layer, the active layer, the second cladding layer, the third cladding layer and the fourth cladding layer to form a mesa including them in a stripe shape.

10. The method of manufacturing a semiconductor laser according to claim 9, further comprising (f) forming a first buried layer on both sides of the mesa in a stripe shape.

11. The method of manufacturing a semiconductor laser according to claim 10, further comprising (g) forming a second buried layer on the first buried layer.

12. The method of manufacturing a semiconductor laser according to claim 11, further comprising (h) forming a fifth cladding layer on the second buried layer and the fourth cladding layer.

13. The method of manufacturing a semiconductor laser according to claim 12, further comprising (i) forming a contact layer on the fifth cladding layer.

14. The method of manufacturing a semiconductor laser according to claim 1, wherein the first, second and third cladding layers are composed of InP.

15. The method of manufacturing a semiconductor laser according to claim 1, wherein in the step (a), the first cladding layer is formed so as to include a diffraction grating having a periodic structure along the waveguide direction of the semiconductor laser.

* * * * *